US006629093B1

United States Patent
Davis et al.

(10) Patent No.: US 6,629,093 B1
(45) Date of Patent: Sep. 30, 2003

(54) METHOD AND APPARATUS FOR SIMPLIFIED COMPUTER AIDED DESIGN (CAD) MODEL SEARCH AND RETRIEVAL

(75) Inventors: Kenneth L. Davis, San Diego, CA (US); Ruth E. Steed, San Diego, CA (US); Amy B. Wagreich, San Diego, CA (US)

(73) Assignee: Autodesk, Inc., San Rafael, CA (US)

( * ) Notice: Subject to any disclaimer, the term of this patent is extended or adjusted under 35 U.S.C. 154(b) by 298 days.

(21) Appl. No.: 09/773,786

(22) Filed: Jan. 31, 2001

(51) Int. Cl.⁷ .................. G06F 17/30; G06F 19/00; G09G 5/00
(52) U.S. Cl. .................. 707/3; 345/964; 700/182
(58) Field of Search .................. 707/1–4, 526, 707/100–101; 715/526; 345/700, 771, 961, 650–655, 964–965; 703/1–2, 0.3; 700/182

(56) References Cited

U.S. PATENT DOCUMENTS

| | | | |
|---|---|---|---|
| 5,526,478 A | | 6/1996 | Russell, Jr. et al. |
| 5,551,028 A | | 8/1996 | Voll et al. |
| 5,701,403 A | * | 12/1997 | Watanabe et al. ........... 345/419 |
| 5,708,764 A | | 1/1998 | Borrel et al. |
| 2001/0056436 A1 | * | 12/2001 | Stejskal et al. ............. 707/200 |
| 2002/0123812 A1 | * | 9/2002 | Jayaram et al. ............. 700/98 |

FOREIGN PATENT DOCUMENTS

WO    PCT/US96/14299    10/1996

OTHER PUBLICATIONS

"PC–based CAE tools—facilitate creation of technical documents," EDN—Electronic Design News, Dec. 8, 1988, No. 25, Part I, Newton, MA, USA.

* cited by examiner

Primary Examiner—Alford Kindred
(74) Attorney, Agent, or Firm—Schwabe, Williamson & Wyatt, PC

(57) ABSTRACT

The invention includes computer instructions that operate to facilitate a search for computer aided design (CAD) model information, and to determine if one or more features defining the CAD model information are received. Once one or more features are received, the instructions search through a number of files, based at least upon the received one or more features defining the CAD model information. Once the CAD model information searched for is located, the instructions operate to retrieve the CAD model information from one or more of the number of files searched, based at least upon the received one or more inputs for defining one or more features of the CAD model information. In one embodiment, the computer instructions are part of a mechanical design software application. In one embodiment, the mechanical software application including the computer instructions is embodied in a distribution storage medium. As a result, desired CAD model information is efficiently searched for and retrieved.

25 Claims, 12 Drawing Sheets

1000

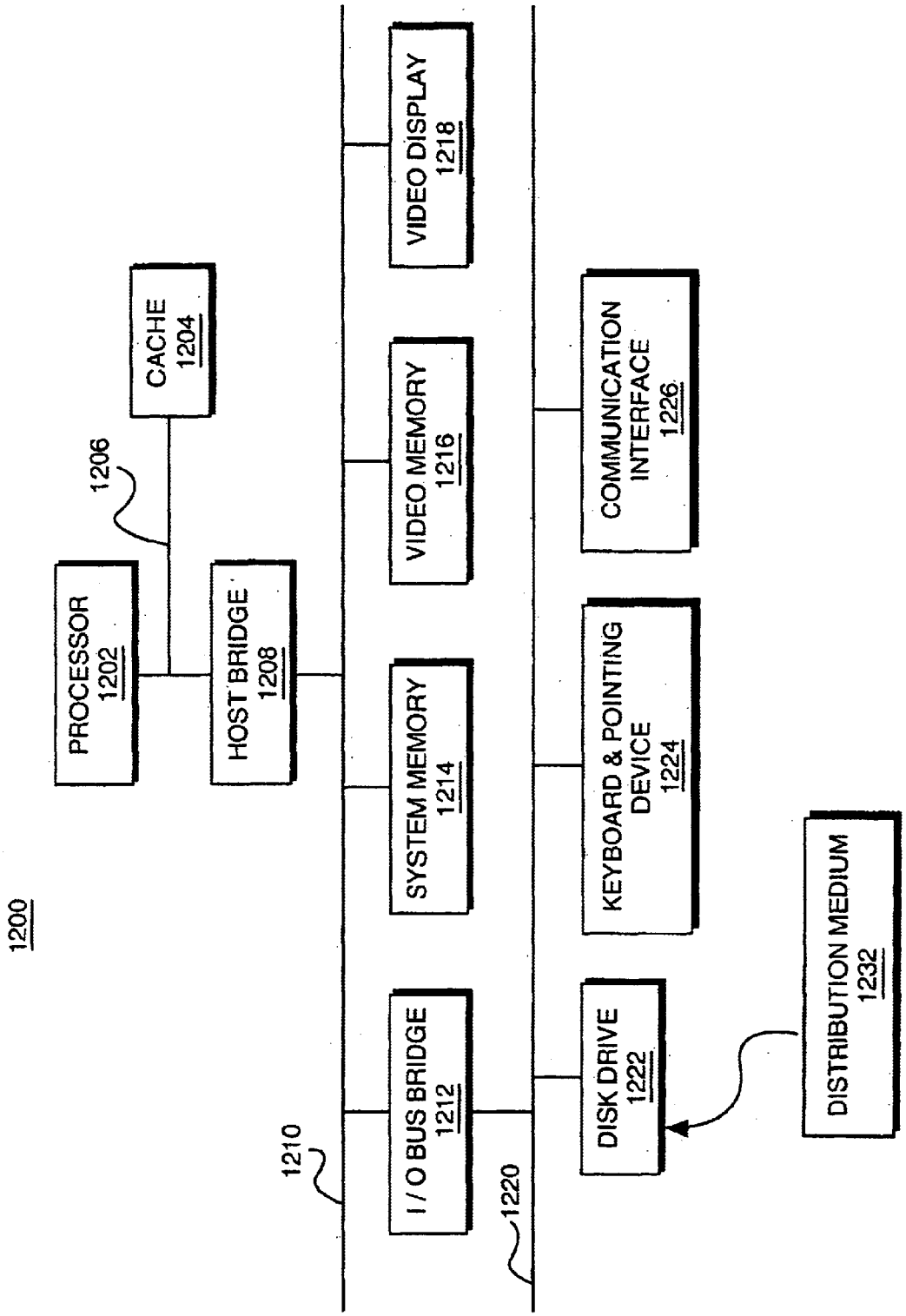

METHOD AND APPARATUS FOR SIMPLIFIED COMPUTER AIDED DESIGN (CAD) MODEL SEARCH AND RETRIEVAL

FIELD OF INVENTION

The invention relates to the field of computer aided design (CAD). More specifically, the invention relates to CAD model search and retrievals.

BACKGROUND OF THE INVENTION

Often times, in engineering, new designs of parts are modifications, improvements, or combinations of existing parts. For example, a company may have a particular part incorporating design improvements over a period of time of the same part. Furthermore, the improvements may involve incorporating designs of other parts. With utilization of computer aided design (CAD) software, a user may make modifications/improvements to a part for a new design without the costs associated with actually modifying/improving the part because the modifications/improvements may be performed in "virtual" space as CAD models, i.e., on a computer.

As CAD is utilized to design parts in "virtual" space, locating these previously designed CAD models can be very tedious because a user searching for a previously designed CAD model may have to search in various storage areas, such as, for example, various disk drives and various directories. Often times, the user searching for the CAD model has to rely upon either a previous user naming a file having the CAD model to describe the type of design or luck. Naming conventions for the file having the CAD model may relieve some of the problems associated with searching for previously designed CAD models, but often times, these naming conventions are not strictly followed, and these naming conventions of files may vary as the CAD model is subsequently modified. Additionally, since a CAD model may not necessarily have text associated with it, a textual search for files having particular CAD models of the desired part may be very difficult.

For example, a user may desire to modify/improve. a particular feature on a part, such as, for example, an attachment hole in the part. This attachment hole may be particular to the part, i.e., a particular attachment hole specifically designed for and integrated into the part. Since the only feature the user desires to modify/improve is the attachment hole, it would not be necessary and very time consuming for the user to design as CAD models both the part and the modifications/improvements to the attachment hole. In order to avoid designing the part, but instead, design the modifications/improvements to the attachment hole, the user is required to search for a file having the CAD model with the attachment hole or at least, the attachment hole.

In order to search for the attachment hole, the user may be required to know a particular given name of the attachment hole or search for files with the CAD model incorporating the attachment hole. In either search, the user would more than likely rely upon a textual search, i.e., a textual search of the file names that may include the desired CAD model or a textual search for: files that may include some textual information describing the CAD model.

Furthermore, once a file containing the desired CAD model is located, often times, the user is required to copy the file into a location familiar with the user. The user is often times limited as to how to copy the file because the user may either copy the entire file or open the file in its foreign location and try to locate the desired CAD model and feature, isolate the CAD model, and export the CAD model to the familiar location of the user. The former method may copy a file with undesired information, such as, for example, CAD geometry or CAD models utilized by a previous user to construct other CAD models associated with the desired CAD model, i.e., too much information. The latter method may require the user to navigate through the file in its foreign location to search for the desired CAD model, and this process may be difficult due to the file having the CAD models may include many layers or some of the geometry/CAD models may be turned invisible.

BRIEF DESCRIPTION OF DRAWINGS

The invention is illustrated by way of example and not by way of limitation in the figures of the accompanying drawings, in which the like references indicate similar elements and in which:

FIG. 10 illustrates one embodiment of the retrieval and copying of the CAD model searched for;

FIG. 12 illustrates one embodiment of a computer system suitable to be programmed with the mechanical design application of the invention.

DETAILED DESCRIPTION OF THE INVENTION

In the following description, various aspects of the invention will be described. However, it will be apparent to those skilled in the art that the invention may be practiced with only some or all aspects of the invention. For purposes of explanation, specific numbers, materials and configurations are set forth in order to provide a thorough understanding of the invention. However, it will also be apparent to one skilled in the art that the invention may be practiced without the specific details. In other instances, well-known features are omitted or simplified in order not to obscure the invention.

Parts of the description will be presented in terms of operations performed by a computer system, using terms such as data, flags, bits, values, characters, strings, numbers and the like, consistent with the manner commonly employed by those skilled in the art to convey the substance of their work to others skilled in the art. As well understood by those skilled in the art, these quantities take the form of electrical, magnetic, or optical signals capable of being stored, transferred, combined, and otherwise manipulated through mechanical and electrical components of the computer system, and the term computer system includes general purpose as well as special purpose data processing machines, systems, and the like, that are standalone, adjunct or embedded.

Various operations will be described as multiple discrete steps in turn, in a manner that is most helpful in understanding the invention, however, the order of description should not be construed as to imply that these operations are necessarily order dependent. In particular, these operations need not be performed in the order of presentation.

In various embodiments of the invention, previously designed computer aided design (CAD) models are efficiently searched and desired CAD model information is efficiently retrieved.

Figure 1:
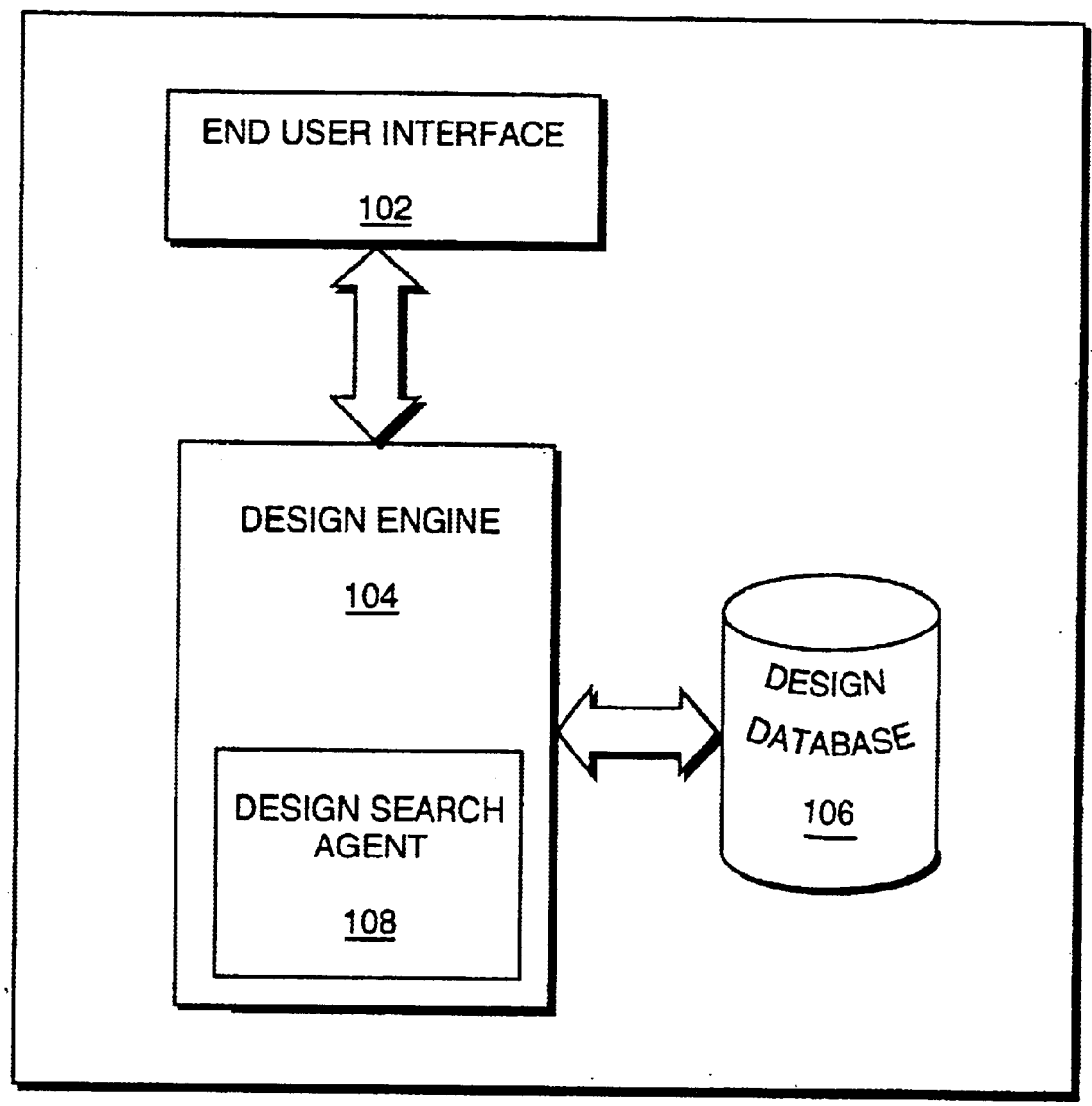
FIG. 1 illustrates a block diagram of one embodiment of a mechanical design application for searching and retrieving desired CAD model information.

FIG. 1 illustrates a block diagram of one embodiment of a mechanical design application for efficiently searching and retrieving desired CAD model information, in accordance with the invention. In FIG. 1, mechanical design application 100 includes an end user interface 102, a design engine 104, and a design database 106. The design engine 104 includes, in particular, a design search agent 108 in accordance with the invention. Together, the elements cooperate to efficiently search and retrieve desired CAD model information.

In FIG. 1, the end user interface 102 operates to graphically display and receive input, from a user, of CAD models under the control of the design engine 104. Also under the control of the design engine 104, the design database 106 operates to store CAD model information for defining a search for the desired CAD model information. In particular, the design search agent 108 utilizes various inputs to efficiently search and retrieve desired CAD model information. Except for the teachings of the invention incorporated in the design search agent 108, the mechanical design application 100 is intended to represent a broad range of CAD software known in the art, including but not limited to Autodesk Inventor™, available from Autodesk, Inc. of San Rafael, Calif.

Figure 2B:
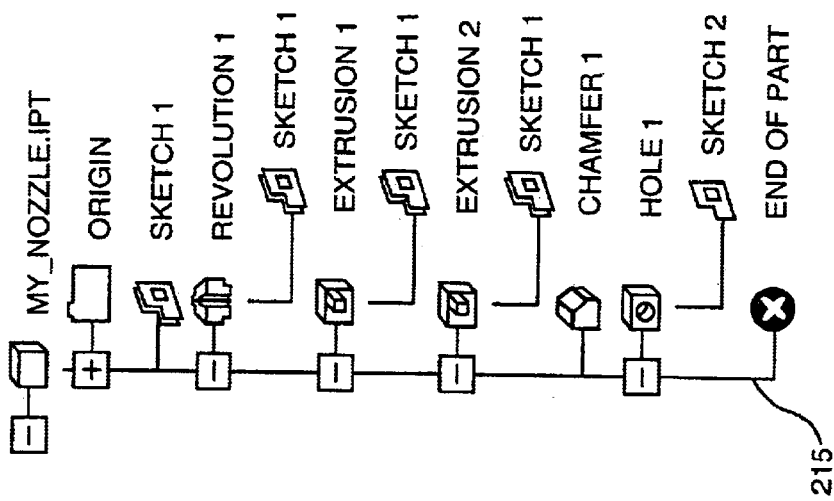
FIGS. 2A & 2B illustrate an example of a CAD model with its CAD model information with which one embodiment of the invention may be practiced.
Figure 2A:
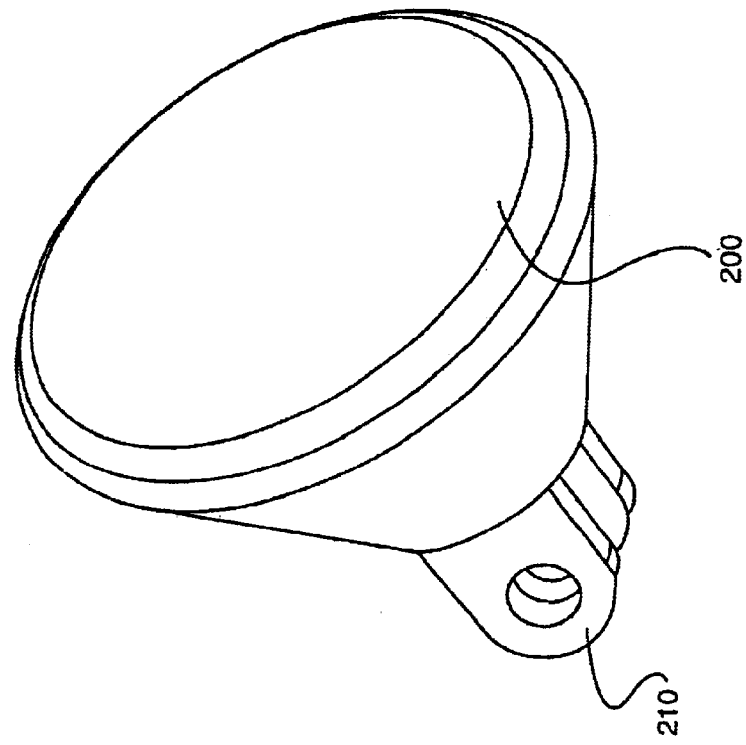

FIGS. 2A & 2B illustrate an example of a CAD model with its CAD model information, with which, one embodiment of the invention may be practiced. Shown in FIG. 2A is a CAD model 200 with various features, such as, but not limited to, an attachment flange 210. This attachment flange 210 may be an attachment flange utilized in various other designs, i.e., many other CAD models may include the attachment flange 210. FIG. 2B, illustrates CAD model information 215, which may be associated with the CAD model 200. This CAD model information 215 includes methods utilized by a user (not shown) to design the CAD model 200, i.e., a history of the methods utilized by the user to design the CAD model 200, where the design engine 104 tracks a sequence of operations received from the user, and this CAD model information 215 may be stored in the design database 106. As shown in FIG. 2B, the CAD model information may be displayed in the form of a browser; however, it should be appreciated by one skilled in the art, that the CAD model information may be displayed in other forms, such as, but not limited to, a menu illustrating a sequence of operations.

Figure 3B:
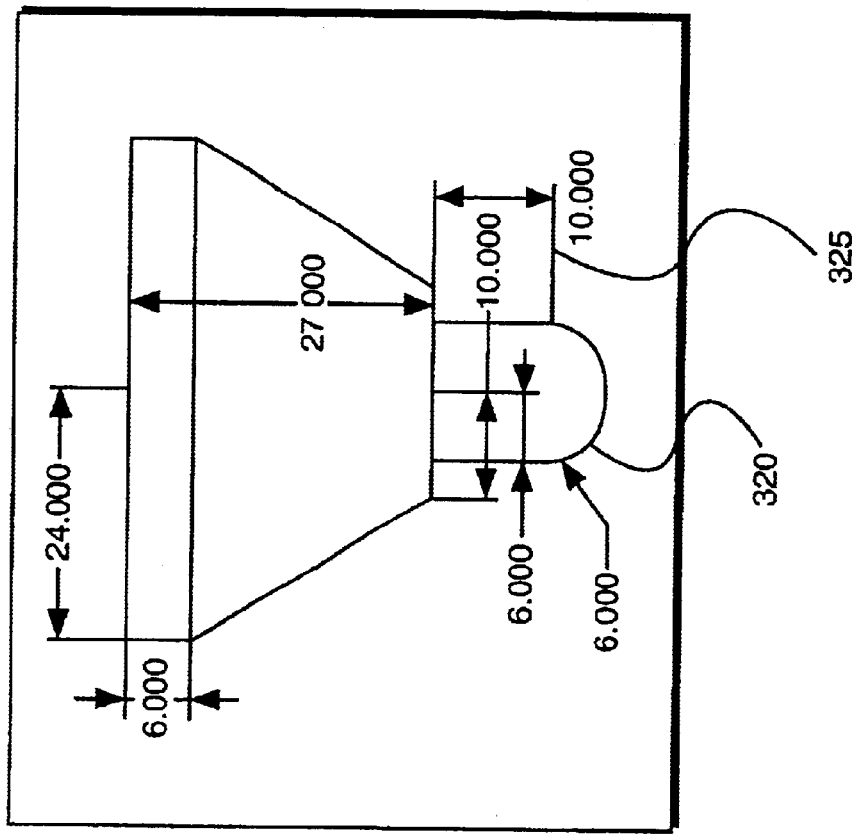
FIGS. 3A & 3B illustrate exemplary CAD model information associated with a CAD model.
Figure 3A:
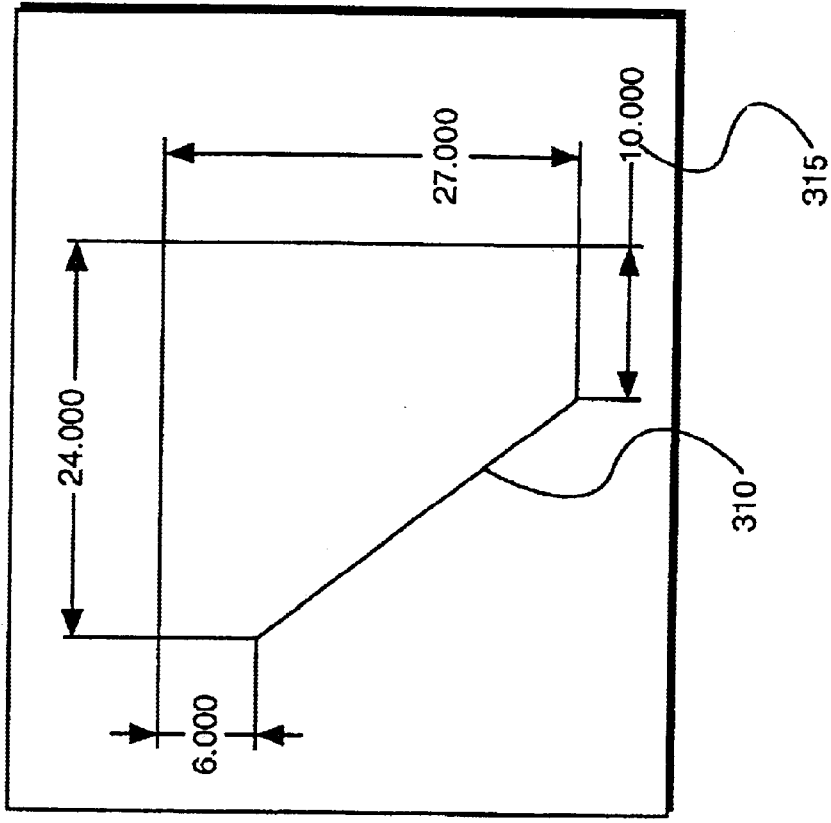

FIGS. 3A & 3B illustrate exemplary CAD model information associated with a CAD model. Shown in FIG. 3A are construction geometries 310 and their corresponding dimensional information inputted by the user to design a part of the CAD model 200 (shown in FIG. 2A). In FIG. 3B, attachment flange construction geometries 320 are shown with its corresponding dimensional information 325. The construction geometries 310 & 320 and their corresponding dimensional information 315 & 325 are inputted and utilized by the user to design various parts of the CAD model 200, and the CAD model information shown in FIGS. 3A & 3B are tracked by the design engine 104 and stored. Furthermore, the CAD model information shown in FIGS. 3A & 3B corresponds to parametric CAD model information, i.e., the user may modify the construction geometries 310 & 320 and their corresponding dimensional information 315 & 325, and this modification automatically updates in the CAD model 200.

Because CAD model information may be parametric, CAD model information is included in a CAD model file. However, more complex CAD models include numerous CAD model information, and therefore, in order to simplify displays of the CAD model, CAD model information, such as the construction geometries 310 & 320 and dimensional information 315 & 325 are either made invisible or placed on different layers in a CAD file. A single CAD file may include many layers, such as, for example, 150 layers, where each layer may be utilized to store CAD information that may be selectively displayed, and is included for the user to construct the CAD model.

In order to search and retrieve CAD model information, parametric CAD model information included in CAD files and various layers are considered. For example, a user may desire to modify the attachment flange 210 (shown in FIG. 2A), and in order to modify the attachment flange 210, the user wants to search for a CAD file having the attachment flange and retrieve a copy of the attachment flange 210 without retrieving unnecessary CAD model information, i.e., CAD model information not pertaining to the attachment flange 210, but other CAD model information utilized by a previous user. Additionally, the user may not have knowledge of the location of the CAD file having the attachment flange 210.

Figure 4:
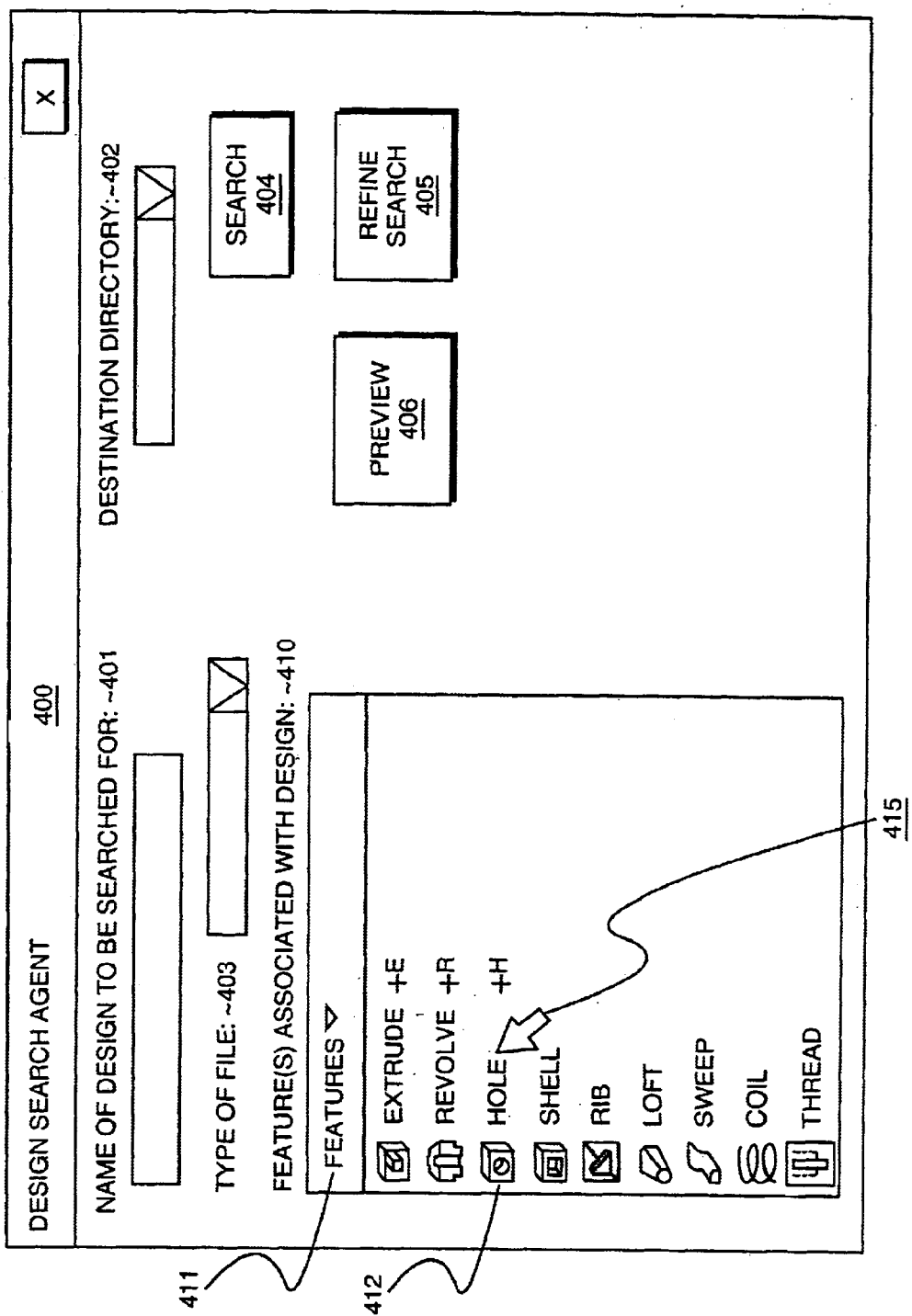
FIG. 4 illustrates one embodiment of search and retrieval of CAD model information.

FIG. 4 illustrates one embodiment of efficient search and retrieval of CAD model information, in accordance with the invention. Shown in FIG. 4 is an exemplary end user interface, such as, but not limited to, a design search agent menu 400 to be filled by a user and received by the design search agent 108 (shown in FIG. 1) to efficiently search and retrieve CAD model information. Included in the design search agent menu 400 are various input selections for the user to fill, a name of design to be searched input 401, a destination directory input 402, a type of file input 403, a search button 404, a refine search button 405, a preview button 406, and a feature(s) associated with design input 410.

The name of the design to be searched for input 401 may function to facilitate the user to input a textual name of the design to be searched, such as, but not limited to, "attachment flange". The destination directory input 402 may facilitate to allow the user to input the location to copy the retrieved CAD model information, such as, but not limited to, "my directory" including a drop down browse feature. The type of file input 403 may facilitate to allow the user to input a particular type of CAD file, such as, but not limited to, a part file (.ipt) or a drawing file (.dwg) also including a dropdown browse feature. The search button 404 facilitates the design search engine 104 to start the search, the refine search button 405 facilitates a refinement of the search inputs after the search, and the preview button 406 facilitates preview display of CAD file after the search. The features associated with design input 410 facilitates the user to efficiently search and retrieve CAD model information, in accordance with one embodiment of the invention.

Shown in FIG. 4, a features menu 411 is generated and displayed upon initial opening of the design search agent menu 400 for the feature(s) associated with design input 410, in accordance with one embodiment of the invention. Alternatively, this features menu 411 may also be displayed upon the user selecting the refine search button 405. As illustrated, the features menu 411 includes various features, such as, but not limited to, extrude, revolve, hole, shell, rib, and so forth, that may be included in the CAD model information of a CAD model. In FIG. 4, in order to search for the attachment flange 210, the user utilizes a cursor 415 to select a hole feature 412 from the features menu 411. Shown in FIG. 4, are a number of various features included in the feature menu 411; however, it should be appreciated by one skilled in the art that the number of various feature may be any number of features known in the art.

Figure 5A:
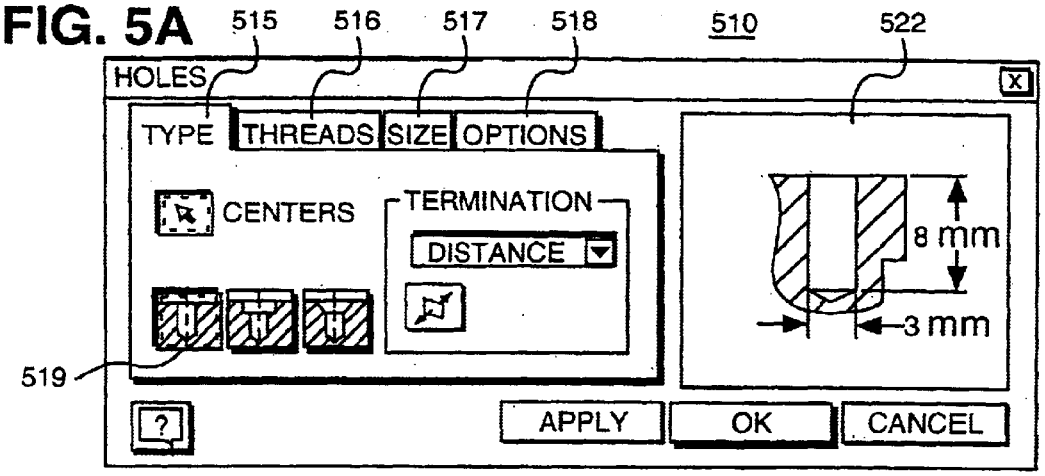
FIGS. 5A–5C illustrate one embodiment of selection menu(s) to further define a selected feature.
Figure 5B:
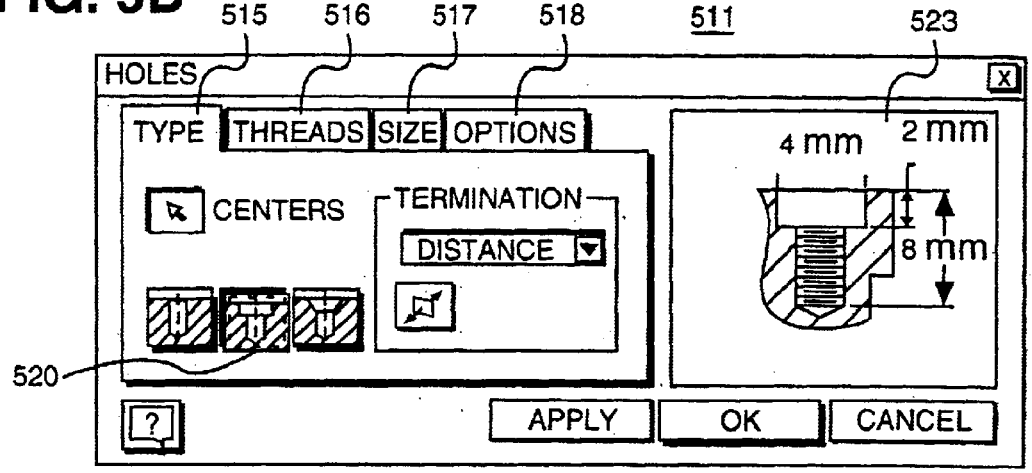
Figure 5C:
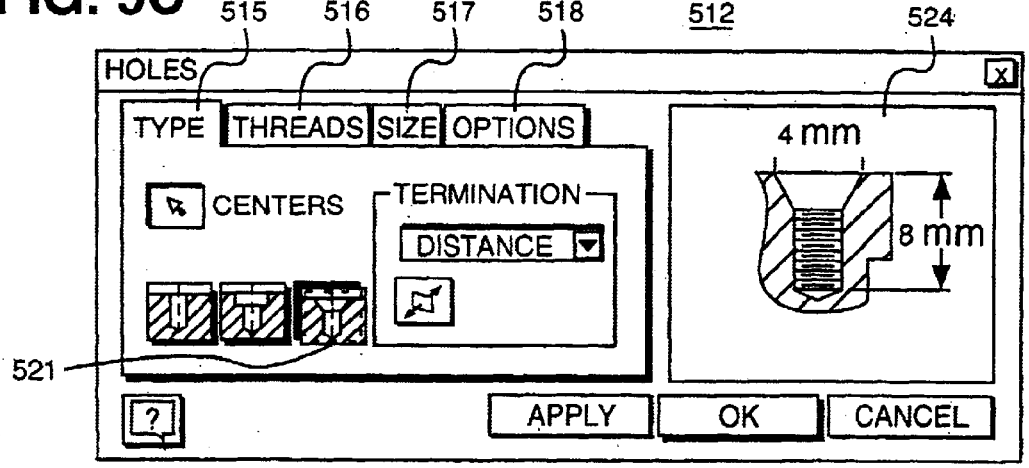

FIGS. 5A–5C illustrate selection menu(s) to further define the selected feature, in accordance with one embodiment of the invention. Referring now to FIGS. 5A–5C, once the feature(s) associated with design input 410 is received, the hole feature 412, the design search agent 108 generates and displays feature selection menu(s) 510–512 to further define the selected feature. Included in the selection menu(s) 510–512 are tabs 515–518, which may be utilized to further define the selected feature, the hole feature 412. Shown in FIGS. 5A–5C are various selections 519–521, such as, but not limited to, various types of holes 519–521 included in the type tab 515.

In FIG. 5A, for example, a straight hole selection 519 is selected, a straight hole schematic 522 is displayed in the hole feature selection menu 510. In FIG. 5B, for example, a counter-bore hole selection 520 is selected, a counter-bore schematic 523 is displayed in the hole feature selection menu 511. In FIG. 5C, for example, a counter-sunk hole selection 521 is selected, a counter-sunk schematic 524 is displayed in the hole feature selection menu 512. In order to search for the desired CAD model information, such as, but not limited to, the attachment flange 210, the straight hole selection 519 may be selected. The user may end the feature menu selections at any time by selecting the "OK" or "Cancel" buttons, in which case, the design search agent menu 400 is generated and displayed returning the user to the design search agent menu 400.

Figure 6A:
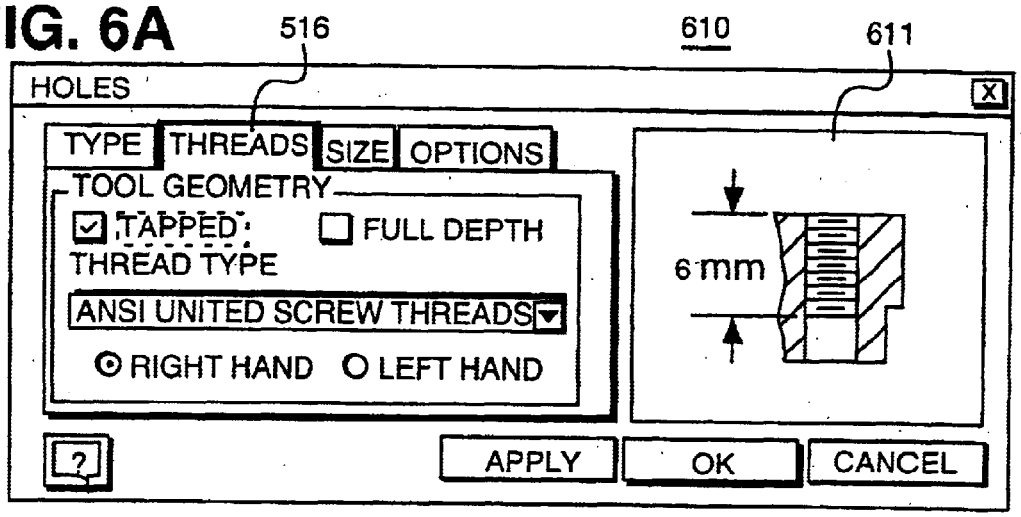
FIGS. 6A–6C illustrate one embodiment of further defining a feature menu to narrow a search for CAD model information.
Figure 6B:
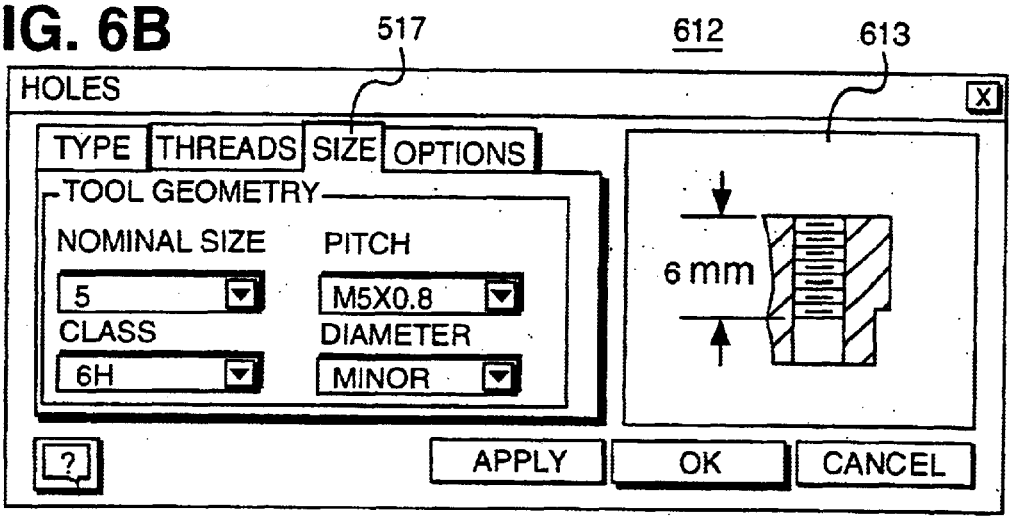
Figure 6C:
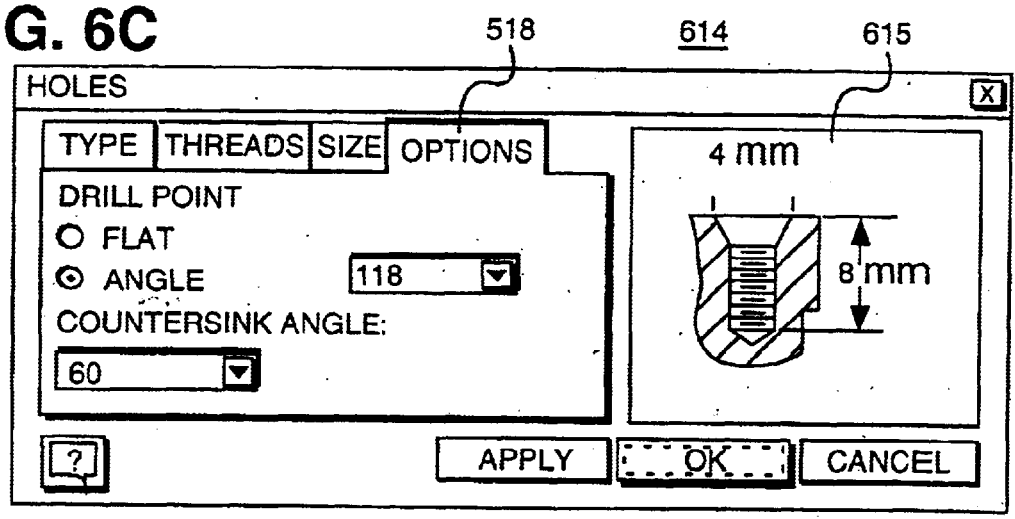

FIGS. 6A–6C illustrate further defining the feature menu to narrow the search for the CAD model information, in accordance with one embodiment of the invention. FIG. 6A illustrates a threads menu 610 with its various selections under the threads tab 516 and a displayed thread schematic 611. FIG. 6B illustrates a size menu 612 with its various selections under the size tab 517 and a displayed size schematic 613. FIG. 6C illustrates an options menu 614 with its various selections under the options tab 518 and a displayed option schematic 615. For the purposes of searching for and retrieving the desired CAD model information, such as, but not limited to, the attachment flange 210, the threads menu 610, the size menu 612, and the options menu 614 may not be applicable because, as can be seen in FIG. 2A, the attachment flange 210 is a straight hole passing through the CAD model 200.

The various selections of FIGS. 5A–5C and 6A–6C are shown to illustrate the various selections, which are available to define the search inputs to increase the efficiency of the search, in accordance with one embodiment of the invention. As a result, CAD model information may be efficiently searched and retrieved.

Figure 7:
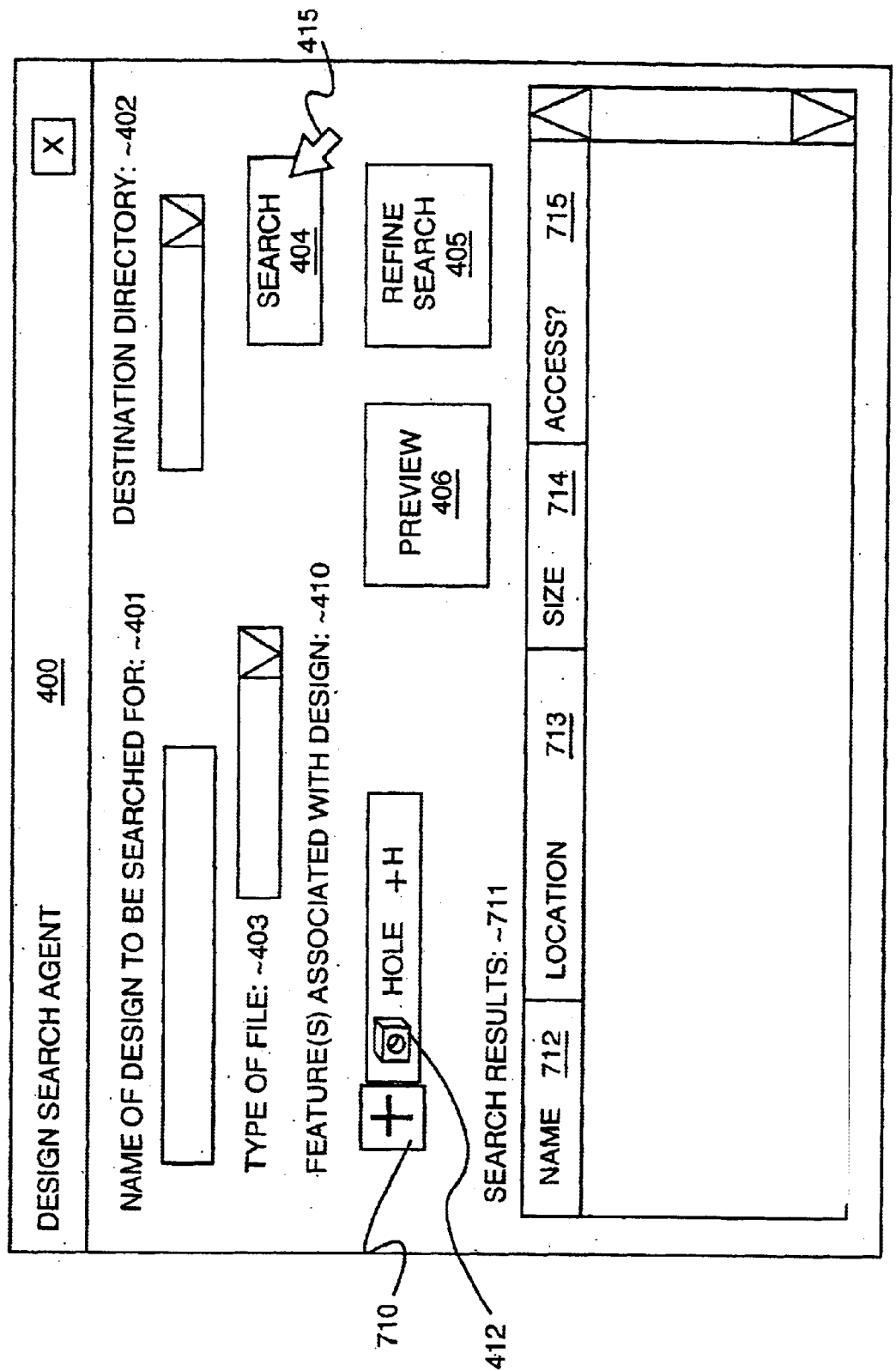
FIG. 7 illustrate one embodiment of a design search agent menu after features(s) associated with the design have been selected and defined.

FIG. 7 illustrates a design search agent menu after features(s) associated with a design have been selected and defined, in accordance with one embodiment of the invention. As shown FIG. 7, the feature(s) associated with design input 410 have the hole feature 412 with an expansion button 710. The expansion button may signify that the hole feature 412 has further defining selections, such as, but not limited to, the selections illustrated in FIGS. 5A–5C and 6A–6C. If the user selects the refine search button 405, the features menu 411 (shown in FIG. 4) is generated and displayed to facilitate the user in further selecting or removing features associated with design.

Additionally, illustrated in FIG. 7, the design search agent menu 400 includes a search results menu 711 having descriptions of files to be retrieved, such as, but not limited to, name 712, location 713, size of the file 714, and information regarding whether access to retrieve and copy the located CAD file is permitted, access status 715, i.e., may be proprietary at a different establishment, where access to copy CAD information may only be allowed after permission.

In FIG. 7, once the desired input fields have been inputted, the search button 404 may selected by the user utilizing the cursor 415, and in response, the design search agent 108 searches for the desired CAD model information, such as, but not limited to, the attachment flange 210.

Figure 8:
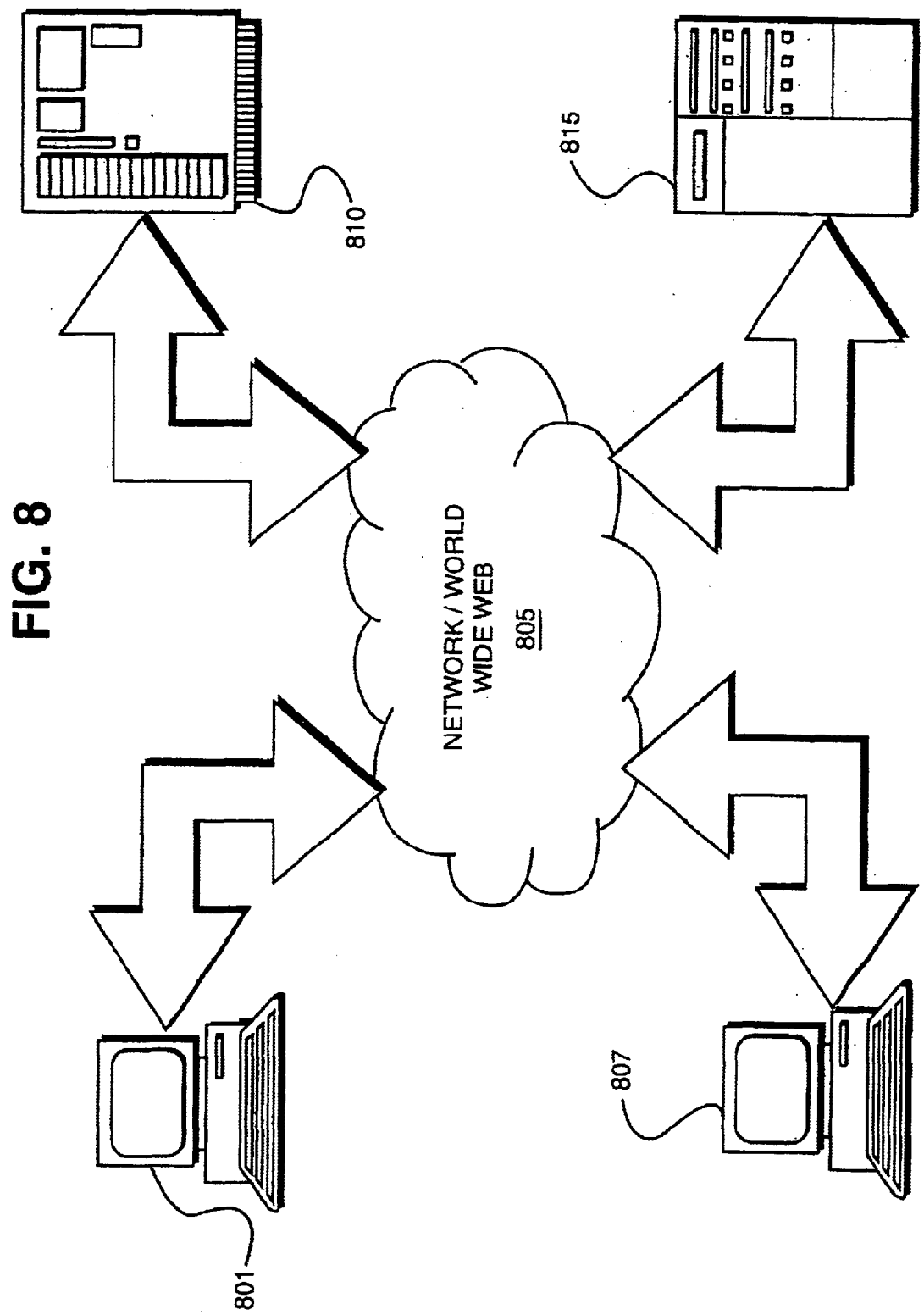
FIG. 8 illustrates one embodiment of various search locations.

FIG. 8 illustrates various search locations, in accordance with one embodiment of the invention. Shown in FIG. 8, the design search agent 108 may be initiated from a first client device 801. The design search agent 108 may search, via a network 805, various locations for the desired CAD model information, the attachment flange 210, such as other client devices 807, accessible servers 815, and other accessible storage areas 810. In one embodiment, the design search agent 108 searches through CAD files, which are of the type inputted (.ipt/.dwg, and etc.) by the user, and searches through CAD model information, such as, but not limited to, the CAD model information 215 in the form of a browser (shown in FIG. 2B). In particular, the design search engine 108 searches through CAD model information utilizing the inputted feature(s) associated with design 410 and its feature selection(s) 412. Furthermore, the design search agent 108 searches CAD model information of various CAD files in order to locate CAD files matching the further feature defining selections, such as but not limited to, the selections illustrated in FIGS. 5A–5C and 6A–6C, designated by the expansion button 710 in the design search agent menu 400.

As a result, CAD model information is efficiently searched and retrieved because of the advantages of defining various selections for the design search agent 108. It should be appreciated by one skilled in the art, that the input fields of the design search agent menu 400 does not need to be filled comprehensively. However, as less information is provided to the design search agent 108, the less defined the search, and thus, a higher possibility of too many results.

Figure 9:
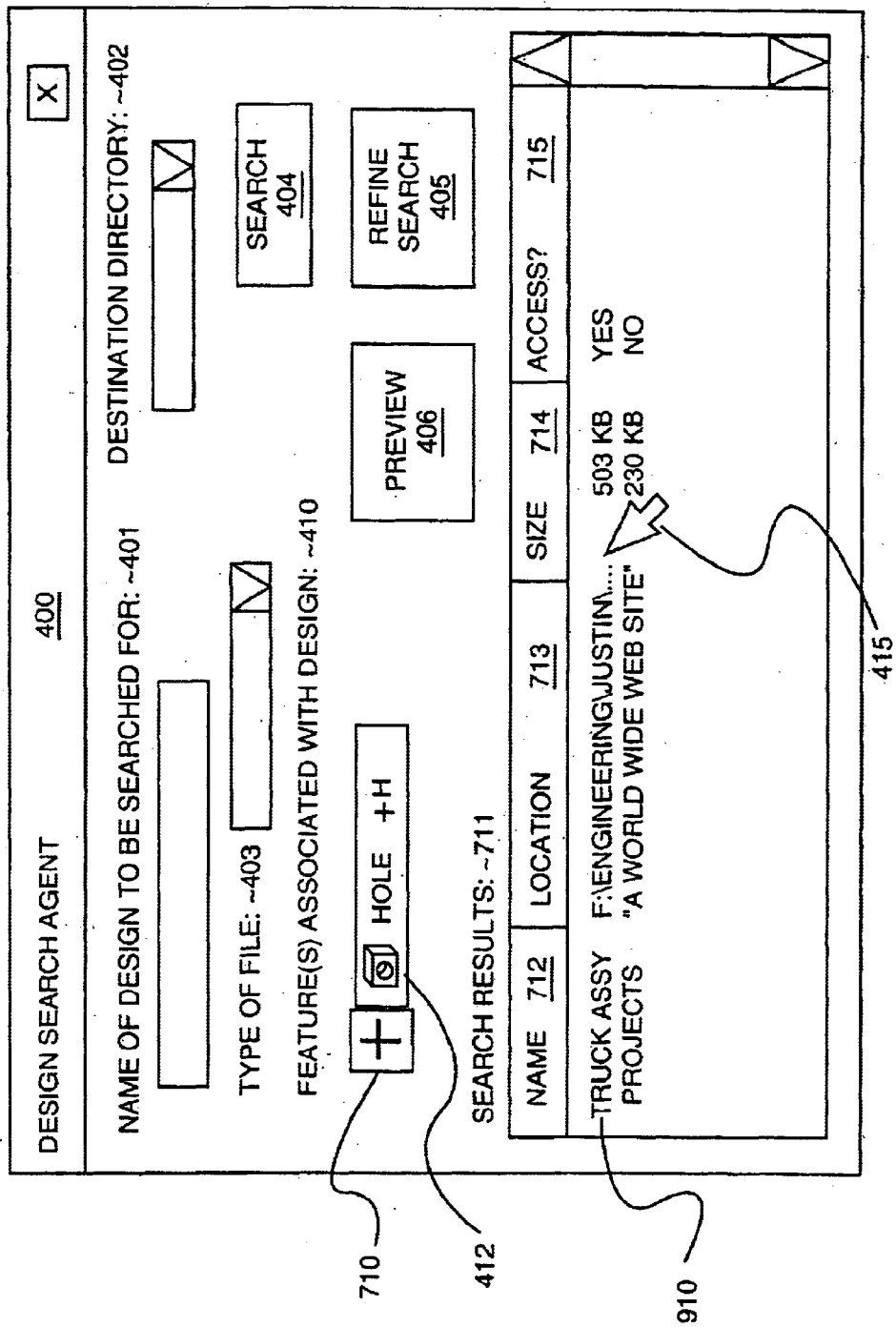
FIG. 9 illustrates one embodiment of a result of an efficient search and retrieval of desired CAD model information.

FIG. 9 illustrates a result of an efficient search and retrieval of desired CAD model information, in accordance with one embodiment of the invention. Shown in FIG. 9, the design search agent menu 400 displays search results 910 in the search results menu 711. As shown, for example, the locations 713 of the search results 910 may be local directories or a world wide web address in a remote location through the world wide web. Also shown in FIG. 9 is the access status 715 of the search results 910 because a CAD file may be posted on a web site of a remote location, but however, access may be denied due to security measures that may be in place, and permission may be required to access the CAD file of the search results 910.

The user may select any one of the search results 910 and select the preview button 406. In response, the search design agent 108 may launch a viewer, such as, but not limited to, a thumbnail program to display a thumbnail image of the CAD model included in the CAD file.

Figure 10:
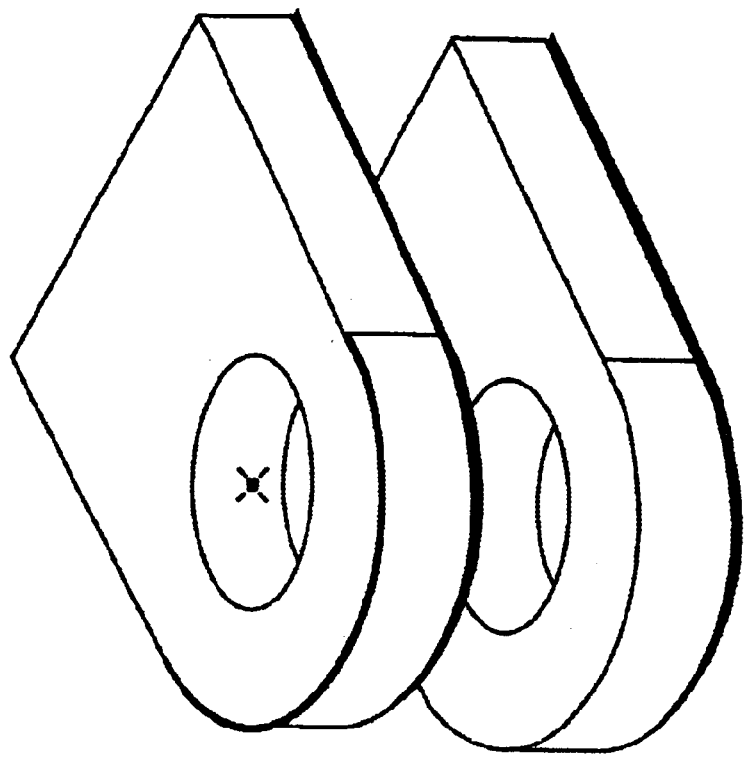

FIG. 10 illustrates the retrieval and copying of the CAD model searched for, in accordance with the invention. In FIG. 10, once a selection of the search results 910 (shown in FIG. 9) is received, the design search agent 108 retrieves only the desired CAD model information corresponding to the inputted information of the design search agent menu 400. That is, referring back to FIG. 2B, the design search agent 108 retrieves only the CAD model information corresponding to the hole feature 412 and its further defining selections and other features not pertaining to the hole feature 412 are ignored. As previously described, the desired CAD model information may be included in more than one layer; however, since the CAD model information may be parametric, all of the desired CAD model information is retrieved and copied regardless of the layer locations. Thus, a user need not open the CAD file and specifically look for the desired CAD model information, and then, look for all of the parametric CAD model information corresponding to the desired CAD model information recalling that there may be more than 100 layers in a single CAD file.

As a result, as shown in FIG. 10, the desired CAD model information 1000, the attachment flange 210, is efficiently retrieved and copied to a desired destination directory 402. The construction geometry 320 and its dimensional information 325 (shown in FIG. 3B), which may be parametric with the desired CAD model information 1000 is also copied and may be placed on a predetermined layer in a new CAD file in the desired destination directory 402.

Figure 11:
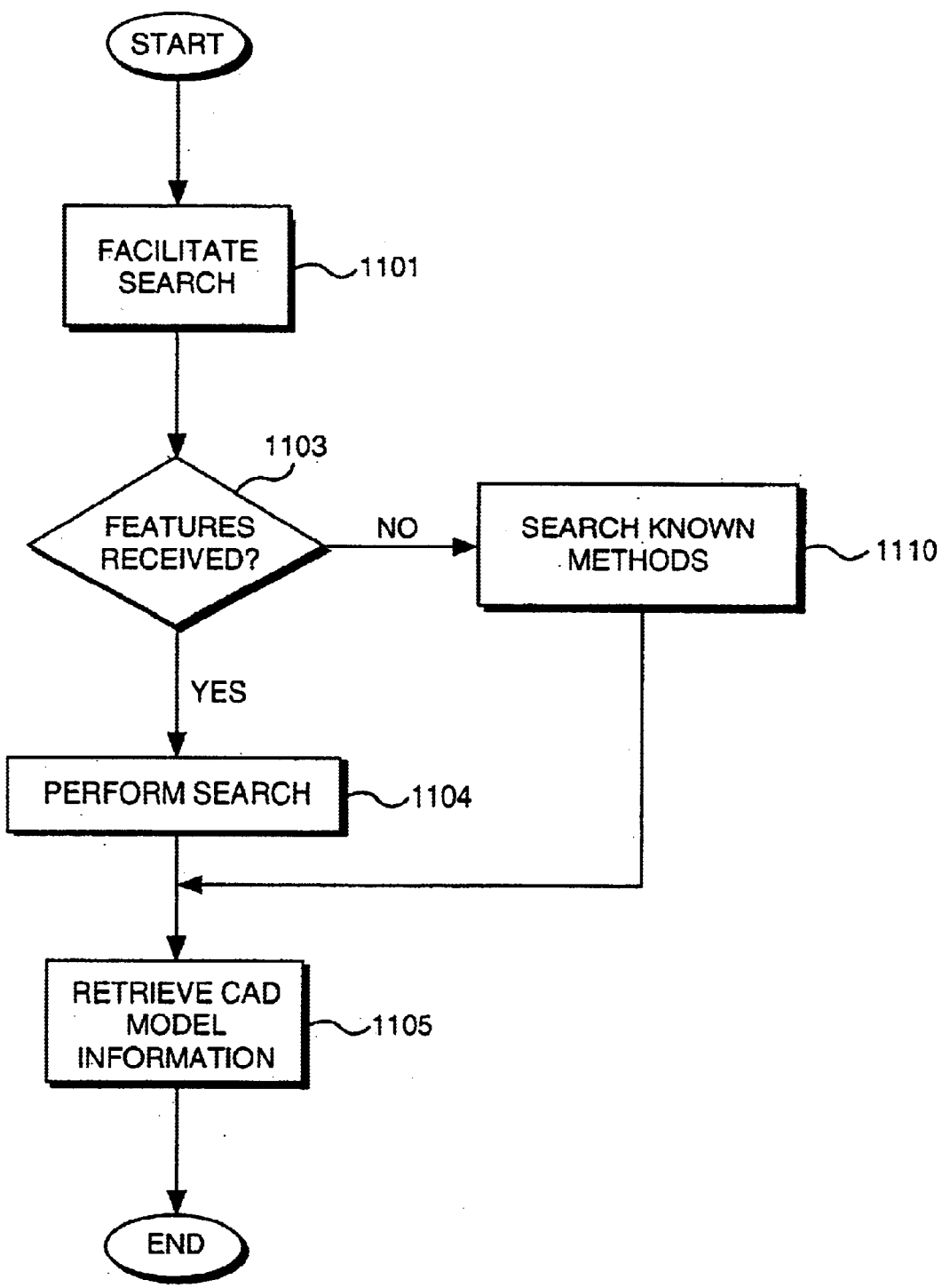
FIG. 11 illustrates the relevant operational flows of one embodiment of the design search agent 108 of FIG. 1.

FIG. 11 illustrates the relevant operational flows of one embodiment of the design search agent 108 of FIG. 1. For the illustrated embodiment, design search agent 108 is programmed in an event driven model, i.e., design search agent 108 is designed to be executed in a system environment where various event notification services are available from the operating system. One example of such an operating system suitable for practicing the invention is the Windows®, Windows® CE, and Pocket PC operating systems, available from Microsoft Corporation of Redmond, Wash. In alternate embodiments, design search agent 108 may be implemented in other programming approaches known in the art.

As shown in FIG. 11, responsive to an event notification informing design search agent 108 of the fact that a design search is to be initiated, design search agent 108 facilitates a search for computer aided design (CAD) model information 1101. This facilitation may be in the form of the design search menu 400, as previously described.

Once the design search menu is generated and displayed, including a geometric features menu, the design search engine 108 determines if one or more features defining the CAD model information is received 1103. The one or more features defining the CAD model information may be geometric features, such as, but not limited to at least one or more of extrude, revolve, hole, shell, and so forth. Additionally, as described above, the design search agent menu may include a variety of input fields, such as, but not limited to a type of CAD file input field, i.e., part or drawing files.

If one or more features defining the CAD model information are received, a search is performed through files in a wide range of locations, such as, but not limited to, other accessible client devices, servers, and other storage devices on the World Wide Web 1104, and this search is based at least upon the received one or more features defining the CAD model information.

CAD model information is retrieved from one or more of the number of files searched, based at least upon the received one or more inputs for defining one or more features of the CAD model information 1105.

However, if one or more features defining the CAD model information is not received, inefficient searches for CAD model information known in the art may be performed, such as, but not limited to a text search 1110.

As a result, CAD model information is efficiently searched and retrieved utilizing advantages of defining various features of CAD model information for the design search agent 108.

FIG. 12 illustrates one embodiment of a computer system suitable to be programmed with the mechanical design application of the invention. As shown, for the illustrated embodiment, computer 1200 includes processor 1202, processor bus 1206, high performance I/O bus 1210 and standard I/O bus 1220. Processor bus 1206, and high performance I/O bus 1210 are bridged by host bridge 1208, whereas I/O buses 1210 and 1220 are bridged by I/O bus bridge 1212. Coupled to processor bus 1206 is cache 1204. Coupled to high performance I/O bus 1210 are system memory 1214 and video memory 1216, against which video display 1218 is coupled. Coupled to standard I/O bus 1220 are disk drive 1222, keyboard and pointing device 1224, and communication interface 1226.

These elements perform their conventional functions known in the art. In particular, disk drive 1222 and system memory 1214 are used to store permanent and working copies of the mechanical design system incorporated with the teachings of the invention. The permanent copy may be pre-loaded into disk drive 1222 in factory, loaded from distribution medium 1232, or down loaded from a remote distribution source (not shown). Distribution medium 1232 may be a tape, a CD, and DVD or other storage medium of the like. The constitutions of these elements are known. Any one of a number implementations of these elements known in the art may be used to form computer system 1200.

In general, those skilled in the art will recognize that the invention is not limited by the details described, instead, the invention can be practiced with modifications and alterations within the spirit and scope of the appended claims. The description is thus to be regarded as illustrative instead of restrictive on the invention.

Thus, an improved way of searching and retrieving previously designed CAD models is disclosed.

What is claimed is:

1. A method comprising:

facilitating a search for computer aided design (CAD) model information;

determining if one or more features defining the CAD model information are received;

upon determining that one or more features are received, searching through a plurality of files, based at least upon the received one or more features defining the CAD model information; and retrieving the CAD model information from one or more of the plurality of files searched, based at least upon the received one or more inputs for defining one or more features of the CAD model information.

2. The method of claim 1 further comprising copying the retrieved CAD model information to a predetermined location.

3. The method of claim 1 further comprising determining if access is permitted to retrieve the CAD model information from one or more of the plurality of files.

4. The method of claim 1, wherein facilitating comprises generating and displaying a design search agent menu.

5. The method of claim 1, wherein facilitating comprises displaying a geometric features menu.

6. The method of claim 5, wherein said geometric features menu includes at least one or more of extrude, revolve, hole, shell, and so forth.

7. The method of claim 1, wherein facilitating comprises displaying a plurality of input fields.

8. The method of claim 7, wherein said plurality of input fields comprises a type of file input field.

9. The method of claim 1, wherein said CAD model information comprises CAD model geometry pieces.

10. The method of claim 1, wherein searching comprises searching at least one of local directories and a World Wide Web.

11. The method of claim 1, wherein searching comprises searching through a plurality of CAD files.

12. The method of claim 11, wherein searching comprises searching through a stored history of CAD model operations.

13. The method of claim 1, wherein retrieving the CAD model information comprises retrieving parametric CAD model information corresponding to the retrieved CAD model information from one or more of the plurality of files.

14. An article comprising a machine accessible medium having instructions encoded therein, said instructions, which when executed by a machine, facilitate a search for computer aided design (CAD) model information, determine if one or more features defining the CAD model information are received, upon determining that one or more features are received, search through a plurality of files, based at least upon the received one or more features defining the CAD model information, and retrieve the CAD model information from one or more of the plurality of files searched, based at least upon the received one or more inputs for defining one or more features of the CAD model information.

15. The article of claim 14, wherein said executing instructions further copy the retrieved CAD model information to a predetermined location.

16. The article of claim 14, wherein said executing instructions further determine if access is permitted to retrieve the CAD model information from one or more of the plurality of files.

17. The article of claim 14, wherein said executing instructions generate and display a design search agent menu.

18. The article of claim 14, wherein said executing instructions display a geometric features menu.

19. The article of claim 18, wherein said CAD model information comprises geometric features of at least one or more of extrude, revolve, hole, shell, and so forth.

20. The article of claim 14, wherein said executing instructions display a plurality of input fields.

21. The article of claim 14, wherein said CAD model information comprises CAD model geometry pieces.

22. The article of claim 14, wherein said executing instructions search at least one of local directories and a World Wide Web.

23. The article of claim 14, wherein said executing instructions search through a plurality of CAD files.

24. The article of claim 23, wherein said executing instructions search through a stored history of CAD model operations.

25. The article of claim 14, wherein said executing instructions retrieve parametric CAD model information corresponding to the retrieved CAD model information from one or more of the plurality of files.

* * * * *